(12) United States Patent
Takahashi et al.

(10) Patent No.: US 10,612,141 B2
(45) Date of Patent: Apr. 7, 2020

(54) FILM FORMING APPARATUS

(71) Applicant: TOKYO ELECTRON LIMITED, Tokyo (JP)

(72) Inventors: Tsuyoshi Takahashi, Yamanashi (JP); Masaki Sano, Yamanashi (JP); Takashi Kamio, Yamanashi (JP); Toshio Takagi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 545 days.

(21) Appl. No.: 14/978,405

(22) Filed: Dec. 22, 2015

(65) Prior Publication Data
US 2016/0177445 A1    Jun. 23, 2016

(30) Foreign Application Priority Data

Dec. 22, 2014   (JP) ................................. 2014-259156

(51) Int. Cl.
*C23C 16/455*    (2006.01)

(52) U.S. Cl.
CPC .. *C23C 16/45544* (2013.01); *C23C 16/45565* (2013.01); *C23C 16/45587* (2013.01); *C23C 16/45589* (2013.01); *C23C 16/45591* (2013.01)

(58) Field of Classification Search
CPC ..... B05B 1/005; C23C 16/34; C23C 16/4412; C23C 16/45506; C23C 16/45508; C23C 16/45544; C23C 16/15565; C23C 16/45574; C23C 16/45589; C23C 16/4583; H01J 37/3244; H01J 37/32449; H01L 21/67069
See application file for complete search history.

(56) References Cited

U.S. PATENT DOCUMENTS

| | | | |
|---|---|---|---|
| 6,179,920 B1 * | 1/2001 | Tarutani ................ | C23C 16/409 118/715 |
| 6,432,259 B1 * | 8/2002 | Noorbakhsh ......... | H01J 37/321 118/723 E |

(Continued)

FOREIGN PATENT DOCUMENTS

| | | |
|---|---|---|
| JP | H10-064831 A | 3/1998 |
| JP | H11-297681 A | 10/1999 |

(Continued)

*Primary Examiner* — Jeffrie R Lund
*Assistant Examiner* — Stanislav Antolin
(74) *Attorney, Agent, or Firm* — Fenwick & West LLP

(57) ABSTRACT

A film forming apparatus includes a mounting table mounting a substrate thereon, a gas diffusion unit above the mounting table, gas dispersion units above the gas diffusion unit, and an evacuation unit to evacuate a processing chamber. The gas diffusion unit has gas injection holes for injecting a gas in a shower shape. Outermost gas injection holes are arranged outward of an outer circumference of the substrate when seen from the top. The gas dispersion units face the gas diffusion unit through a diffusion space therebetween. Each of the gas dispersion units has gas discharge holes formed along a circumferential direction thereof to disperse a gas horizontally into the diffusion space. The gas dispersion units include at least three first gas dispersion units along a first circle, and at least three second gas dispersion units along a second circle concentrically disposed at an outer side of the first circle.

11 Claims, 11 Drawing Sheets

(56) References Cited

U.S. PATENT DOCUMENTS

| | | | | |
|---|---|---|---|---|
| 6,444,039 B1 * | 9/2002 | Nguyen | ............... | C23C 16/455 118/715 |
| 9,441,293 B2 * | 9/2016 | Saitou | ............... | C23C 16/34 |
| 2003/0041971 A1 * | 3/2003 | Kido | ............... | H01J 37/3244 156/345.33 |
| 2006/0060141 A1 * | 3/2006 | Kamaishi | ............ | H01J 37/3244 118/715 |
| 2006/0174827 A1 * | 8/2006 | Bae | ............... | C23C 16/45563 117/200 |
| 2007/0202701 A1 * | 8/2007 | Nakaya | ............... | H01L 21/3065 438/689 |
| 2008/0230518 A1 * | 9/2008 | Brillhart | ............ | C23C 16/45502 216/58 |
| 2009/0223449 A1 * | 9/2009 | Ishida | ............... | H01L 21/67069 118/715 |
| 2010/0136216 A1 * | 6/2010 | Tsuei | ............... | C23C 16/45559 427/9 |
| 2010/0311249 A1 * | 12/2010 | White | ............... | C23C 16/45565 438/758 |
| 2012/0031339 A1 * | 2/2012 | Ono | ............... | C23C 14/12 118/724 |
| 2012/0312231 A1 * | 12/2012 | Li | ............... | C23C 16/303 118/715 |
| 2013/0199729 A1 | 8/2013 | Ishida | | |
| 2014/0090599 A1 * | 4/2014 | Saitou | ............... | B05B 1/005 118/728 |
| 2015/0047567 A1 * | 2/2015 | Saitou | ............... | C23C 16/34 118/729 |
| 2015/0187593 A1 * | 7/2015 | Narushima | ............ | H01L 21/6708 438/735 |
| 2015/0267298 A1 * | 9/2015 | Saitou | ............... | C23C 16/45565 118/725 |

FOREIGN PATENT DOCUMENTS

| | | | | | |
|---|---|---|---|---|---|
| JP | 2007-227829 A | | 9/2007 | | |
| JP | 2008-277773 A | | 11/2008 | | |
| JP | 2013-165276 | | 8/2013 | | |
| JP | 2014-070249 | | 4/2014 | | |
| JP | 2014070249 A | * | 4/2014 | ............ | B05B 1/005 |
| JP | 2015144249 A | * | 8/2015 | ........ | H01L 21/6708 |
| JP | 2015175060 A | * | 10/2015 | ....... | C23C 16/45565 |
| KR | 10-2014-0042699 A | | 4/2014 | | |
| KR | 10-2014-0141701 A | | 12/2014 | | |
| WO | WO-2013145630 A1 | * | 10/2013 | ............ | C23C 16/34 |

* cited by examiner

FILM FORMING APPARATUS

CROSS-REFERENCE TO RELATED APPLICATIONS

This application claims priority to Japanese Patent Application No. 2014-259156 filed on Dec. 22, 2014, the entire contents of which are incorporated herein by reference.

FIELD OF THE INVENTION

The disclosure relates to a technique for forming a film by supplying a processing gas onto a surface of a substrate under a vacuum atmosphere.

BACKGROUND OF THE INVENTION

As a method for forming a film on a semiconductor wafer (hereinafter, referred to as "wafer") as a substrate, there is known a method referred to as a so-called ALD (atomic layer deposition) method or the like in which a thin film is formed by sequentially supplying a source gas and a reactant gas that reacts with the source gas to the wafer and depositing a molecular layer of by-product on a surface of the wafer.

In the ALD method, it is required to supply a replacement gas for replacing an atmosphere between the supply of the source gas and the supply of the reactant gas. In order to obtain a high throughput, the replacement of the atmosphere needs to be quickly carried out and a formed film needs to have good in-plane uniformity.

Recently, a film of nanometer order may require in-plane thickness uniformity in the wafer surface, e.g., about 2% or less based on $1\sigma$ %, to be described later, which is percentage obtained by dividing standard deviation $\sigma$ by average. Accordingly, it is required to develop a gas supply structure capable of providing good replacing performance and realizing film formation while ensuring good in-plane uniformity.

As the gas supply structure, there is known an apparatus for supplying a processing gas into a processing chamber through a shower head, which is disclosed in Japanese Patent Application Publication No. 2013-165276. However, in this apparatus, there is problem that dispersiveness of the processing gas in the shower head is poor and hence the in-plane thickness uniformity of the formed film is poor.

In addition, there is known a film forming apparatus, disclosed in Japanese Patent Application Publication No. 2014-070249, which includes a gas dispersion unit that horizontally discharges a gas into a diffusion space by using a shower head having good replacement efficiency due to a small diffusion space. In this apparatus, flow direction of the discharged gas is changed and then, the discharged gas passes through a bottom surface of the shower head. However, in this apparatus, there are problems that the gas flow is poor in a region below the gas dispersion unit provided at the center of the diffusion space, so that film thickness difference increases between a central portion and a peripheral portion, which makes it difficult to improve the in-plane uniformity of the film thickness, and that the supply of the processing gas is not sufficient at the peripheral portion of a substrate, so that a film thickness at the peripheral portion of the substrate is not stable.

SUMMARY OF THE INVENTION

In view of the above, the disclosure provides a film forming apparatus, in which plural kinds of reactant gases reacting with one another under a vacuum atmosphere are sequentially supplied with supply of a replacement gas between the supplies of the reactant gases to perform a film forming process, capable of performing a film forming process that provides good replacing performance between each of the reactant gas and the replacement gas and ensures excellent in-plane uniformity In accordance with an aspect, there is provided a film forming apparatus for performing a film forming process by sequentially supplying plural kinds of reactant gases that react with one another to a substrate in a processing chamber in a vacuum atmosphere and supplying a replacement gas between supply of one reactant gas and supply of a next reactant gas. The film forming apparatus includes: a mounting table provided in the processing chamber and, and configured to mount thereon the substrate; a gas diffusion unit; a plurality of gas dispersion units; and an evacuation unit configured to evacuate the processing chamber. The gas diffusion unit is disposed above the mounting table, and serves as a ceiling portion of the film forming apparatus. The gas diffusion unit has a plurality of gas injection holes for injecting a gas in a shower shape. Outermost gas injection holes are arranged outward of an outer circumference of the substrate when seen from the top. The gas dispersion units are provided above the gas diffusion unit to face the gas diffusion unit through a diffusion space therebetween. Each of the gas dispersion units has gas discharge holes formed along a circumferential direction thereof to disperse a gas horizontally into the diffusion space. The gas dispersion units include at least three first gas dispersion units spaced apart from each other at a regular interval along a first circle having a center corresponding to a center of the substrate on the mounting table when seen from the top, and at least three second gas dispersion units spaced apart from each other at a regular interval along a second circle concentrically disposed at an outer side of the first circle.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

A configuration of a film forming apparatus according to an embodiment will be described. The film forming apparatus is configured to form a TiN film by a so-called ALD method in which $TiCl_4$ gas (source gas) and $NH_3$ gas (reactant gas) reacting with each other are alternately supplied onto a circular substrate (disc-shaped substrate) as a film forming target, e.g., a wafer having a diameter of 300 mm.

Figure 1:
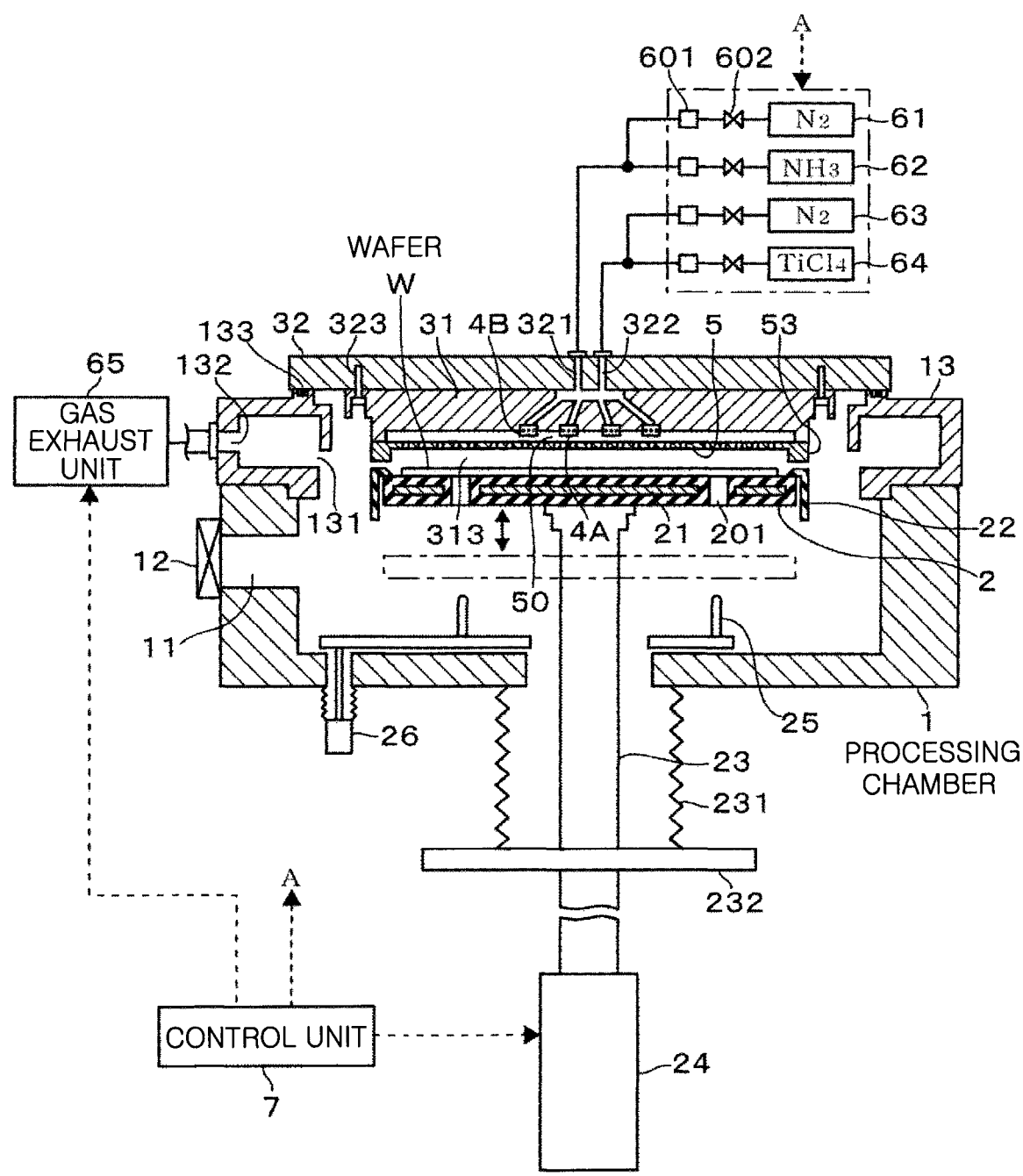
FIG. 1 is a vertical cross sectional view of a film forming apparatus according to an embodiment.
Figure 2:
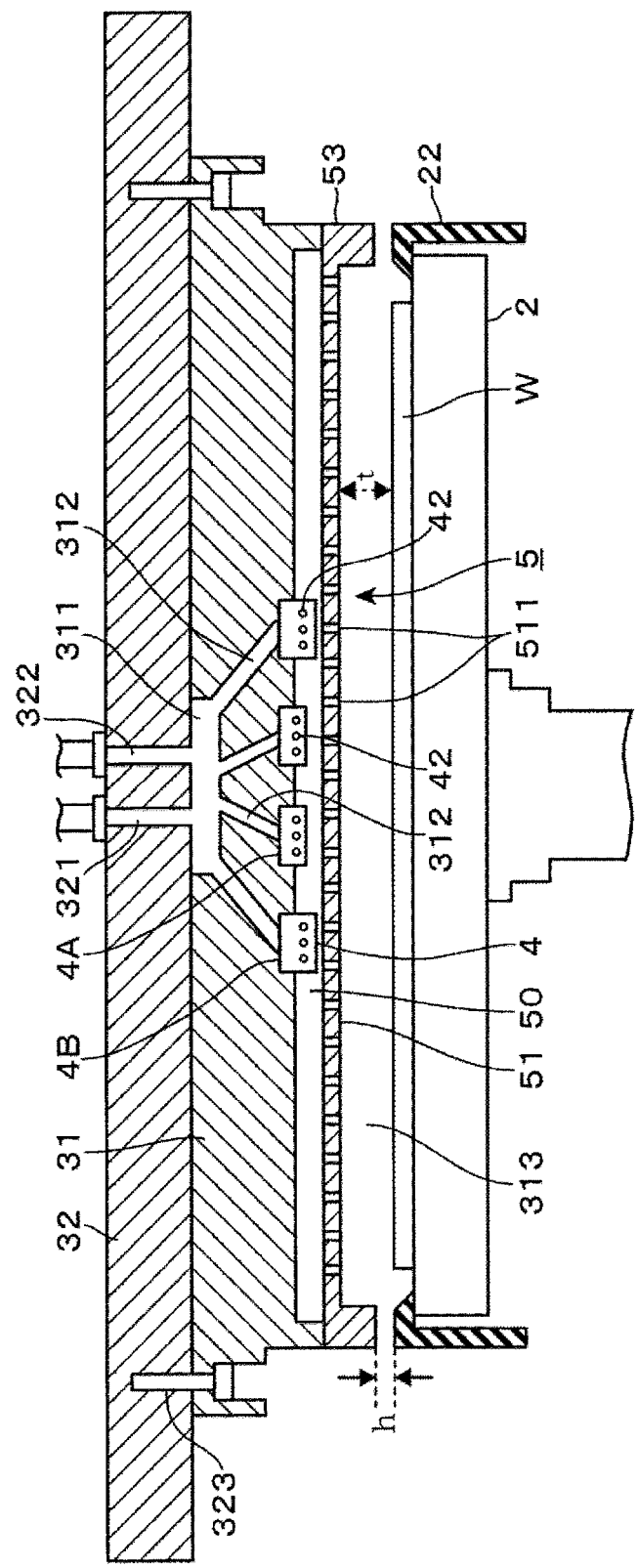
FIG. 2 is a partially enlarged vertical cross sectional view of the film forming apparatus.

As shown in FIGS. 1 and 2, the film forming apparatus includes a processing chamber 1 that is a vacuum container made of a metal such as aluminum or the like and having a substantially circular shape when seen from the top. Provided in the processing chamber 1 is a mounting table 2 for mounting thereon a wafer W. Provided at a side wall of the processing chamber 1 are a loading/unloading port 11 through which a wafer transfer unit provided in an external vacuum transfer path enters the processing chamber 1 to transfer the wafer W with respect to the mounting table 2 and a gate valve 12 for opening/closing the loading/unloading port 11.

A gas exhaust duct 13 made of a metal such as aluminum or the like is provided above the loading/unloading port 11 to be disposed on the sidewall forming a main body of the processing chamber 1. The gas exhaust duct 13 is formed by bending a duct having a polygonal vertical cross sectional shape in a circular ring shape. A slit-shaped opening 131 extending along a circumferential direction is formed at an inner circumferential surface of the gas exhaust duct 13. A gas flowing from a processing space 313 is discharged into the gas exhaust duct 13 through the opening 131. A gas exhaust port 132 is formed at an outer wall surface of the gas exhaust duct 13. A gas exhaust unit 65 including a vacuum pump or the like is connected to the gas exhaust port 132. The gas exhaust port 132 or the gas exhaust unit 65 serves as a vacuum exhaust unit for evacuating the processing space 313.

In the processing chamber 1, the mounting table 2 is disposed at a position inward of the gas exhaust duct 13. The mounting table 2 is a circular plate larger than the wafer W and made of a ceramic such as AlN, $SiO_2$ and the like, or a metal such as Al, Hastelloy (Registered Trademark) and the like. A heater 21 is buried in the mounting table 2 for heating the wafer W to a film forming temperature, e.g., about 350° C. to 550° C. If necessary, there may be provided an electrostatic chuck (not shown) for holding the wafer W in a mounting area of the top surface of the mounting table 2. The heater 21 is not illustrated in other vertical cross sectional views except for FIG. 1.

Provided at the mounting table 2 is a cover member 22 configured to cover an outer peripheral region of the mounting region and a side surface of the mounting table 2 along the circumferential direction. The cover member 22 is made of, e.g., alumina or the like, and has a substantially cylindrical shape having an open top and an open bottom. An upper end portion of the cover member 22 is bent inward in a horizontal direction along the circumferential direction. The bent portion is engaged with the peripheral portion of the mounting table 2. A thickness of the bent portion is greater than a thickness of the wafer W (e.g., 0.8 mm) and is within a range from about 1 mm to 5 mm, about 3 mm, for example.

Connected to a central portion of a bottom surface of the mounting table 2 is a supporting member 23 extending in a vertical direction while penetrating through a bottom surface of the processing chamber 1. A lower end portion of the supporting member 23 is connected to an elevation unit 24 through a plate-shaped supporting base 232 horizontally provided below the processing chamber 1. The elevation unit 24 vertically moves the mounting table 2 between a transfer position, indicated by a dashed dotted line in FIG. 1, where the wafer W is transferred to and from the wafer transfer unit introduced through the loading/unloading port 11 and a processing position, higher than the transfer position, where the wafer W is subjected to film formation.

A bellows 231 is provided between the supporting base 232 and the bottom surface of the processing chamber 1 to circumferentially cover the supporting member 23. The bellows 231 isolates an atmosphere in the processing chamber 1 from the outside and expands/contracts in response to the vertical movement of the supporting base 232.

Provided below the mounting table 2 are supporting pins 25 (e.g., three supporting pins) that lift the wafer W from a backside thereof to transfer and receive the wafer W to and from the external wafer transfer unit. The supporting pins 25 are connected to the elevation unit 26 to be vertically movable. The supporting pins 25 can protrude beyond the top surface of the mounting table 2 and retract through holes 201 vertically extending through the mounting table 2, so that the supporting pins 25 transfer and receive the wafer W to and from the wafer transfer unit.

A disk-shaped supporting plate 32 is provided on the top surface of the gas exhaust duct 13 to cover the circular opening of the gas exhaust duct 13. An O-ring 133 for airtightly sealing the processing chamber 1 is provided between the gas exhaust duct 13 and the supporting plate 32. A ceiling plate member 31 for supplying a reactant gas and a replacement gas into the processing space 313 is provided at the bottom surface of the supporting plate 32. The ceiling plate member 31 is held and fixed to the supporting plate 32 by bolts 323.

A recess is formed at the bottom surface of the ceiling plate member 31. The recess has a flat central area. A shower head 5 serving as a gas diffusion unit is provided below the ceiling plate member 31 to cover the entire bottom surface of the ceiling plate member 31. The shower head 5 includes a disc portion made of, e.g., a metal and having a flat surface facing the mounting table 2, and an annular protrusion 53 protruding downward from a peripheral edge of the disc portion. The ceiling plate member 31 and the supporting plate 32 form a ceiling portion of the film forming apparatus.

When the mounting table 2 is raised to the processing position, the lower end of the annular protrusion 53 faces the top surface of the cover member 22 provided at the mounting table 2. A space surrounded by the bottom surface of the shower head 5, the annular protrusion 53, and the top surface of the mounting table 2 forms the processing space 313 where the wafer W is subjected to film formation.

As shown in FIG. 2, a height of the processing position is set such that a gap having a height h is formed between the lower end of the annular protrusion 53 and the top surface of the bent portion of the cover member 22. The opening 131 of the gas exhaust duct 13 is opened toward the gap. The height h of the gap between the lower end of the annular protrusion 53 and the cover member 22 is set to be, e.g., 3.0 mm within a range from 0.2 mm to 10.0 mm.

By bringing a flat bottom surface of the ceiling plate member 31 and a flat top surface of the shower head 5 into contact with each other, the ceiling plate member 31 and the shower head 5 are clamped to each other and a diffusion space 50 for diffusing a gas is formed therebetween. In the present embodiment, the ceiling plate member 31 corresponds to a facing portion which faces the shower head 5. A plurality of gas injection holes 511 is formed in the shower head 5 (bellow the diffusion space 50), so that the reactant gas can be supplied toward the wafer W.

In the shower head 5 of the present embodiment, a diameter of the diffusion space 50, i.e., a diameter of the gas supply area 51, is set to about 310 mm (radius of 155 mm); a height of the diffusion space 50 is set to about 8 mm; and a volume of the diffusion space 50 except volumes of a first and a second gas dispersion unit 4A and 4B to be described later is set to about 600 cm$^3$.

If the shower head 5 with the diffusion space 50 having a diameter of 310 mm is provided above the central portion of the wafer W having a diameter of 300 mm (radius of 150 mm) mounted on the mounting table 2, the gas injection holes 511 formed at the outermost portion of the shower head 5 are disposed at a position outward of the outer periphery of the wafer W when seen from the top.

The height t from the top surface of the wafer W on the mounting table 2 to the gas injection holes 511 of the gas supply area 51 is set to about 6 mm to 50 mm, preferably about 7 mm to 17 mm. If the height t exceeds 50 mm, the gas replacement efficiency is decreased.

Figure 3:
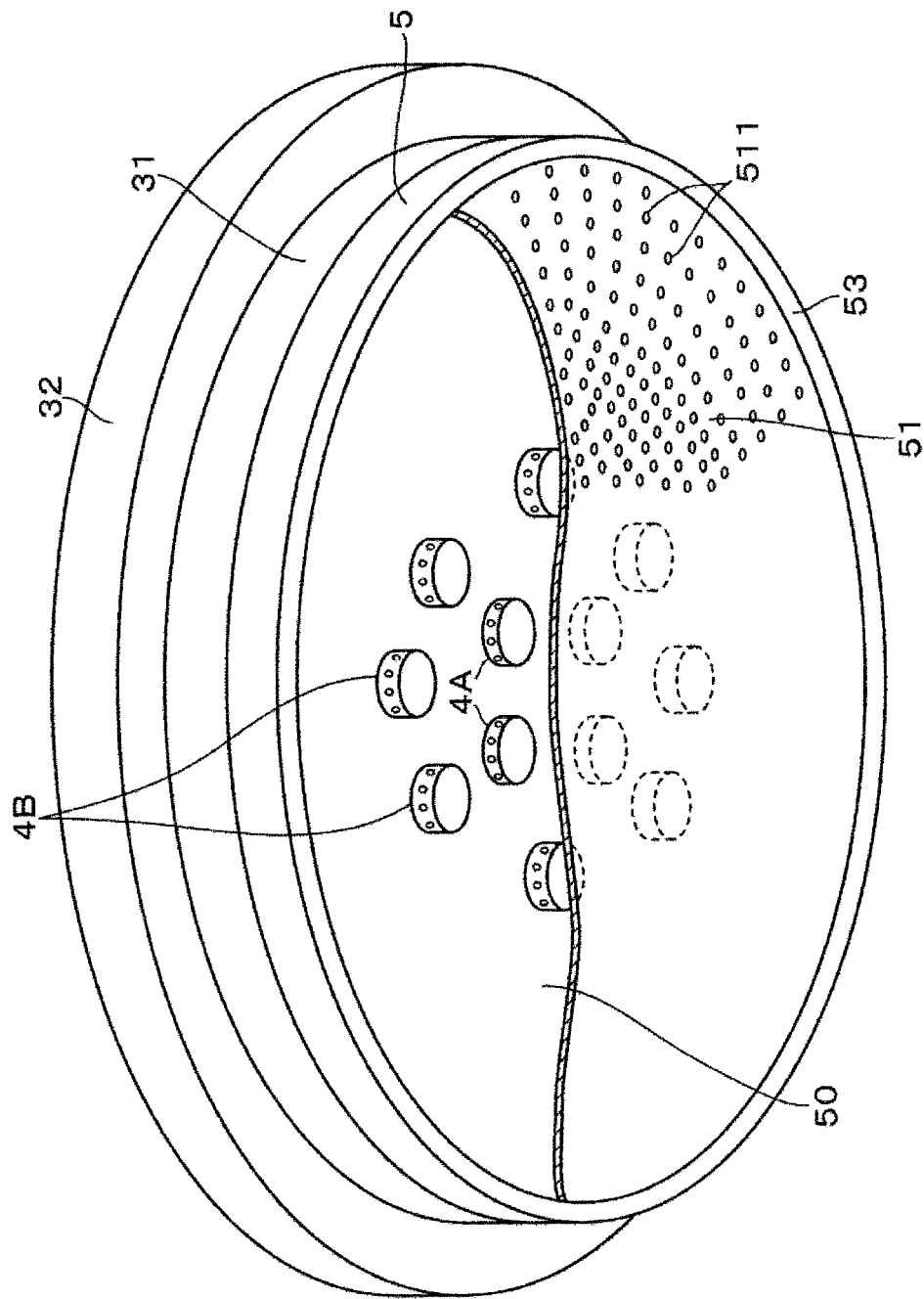
FIG. 3 is a perspective view of a ceiling plate member of the film forming apparatus.
Figure 4:
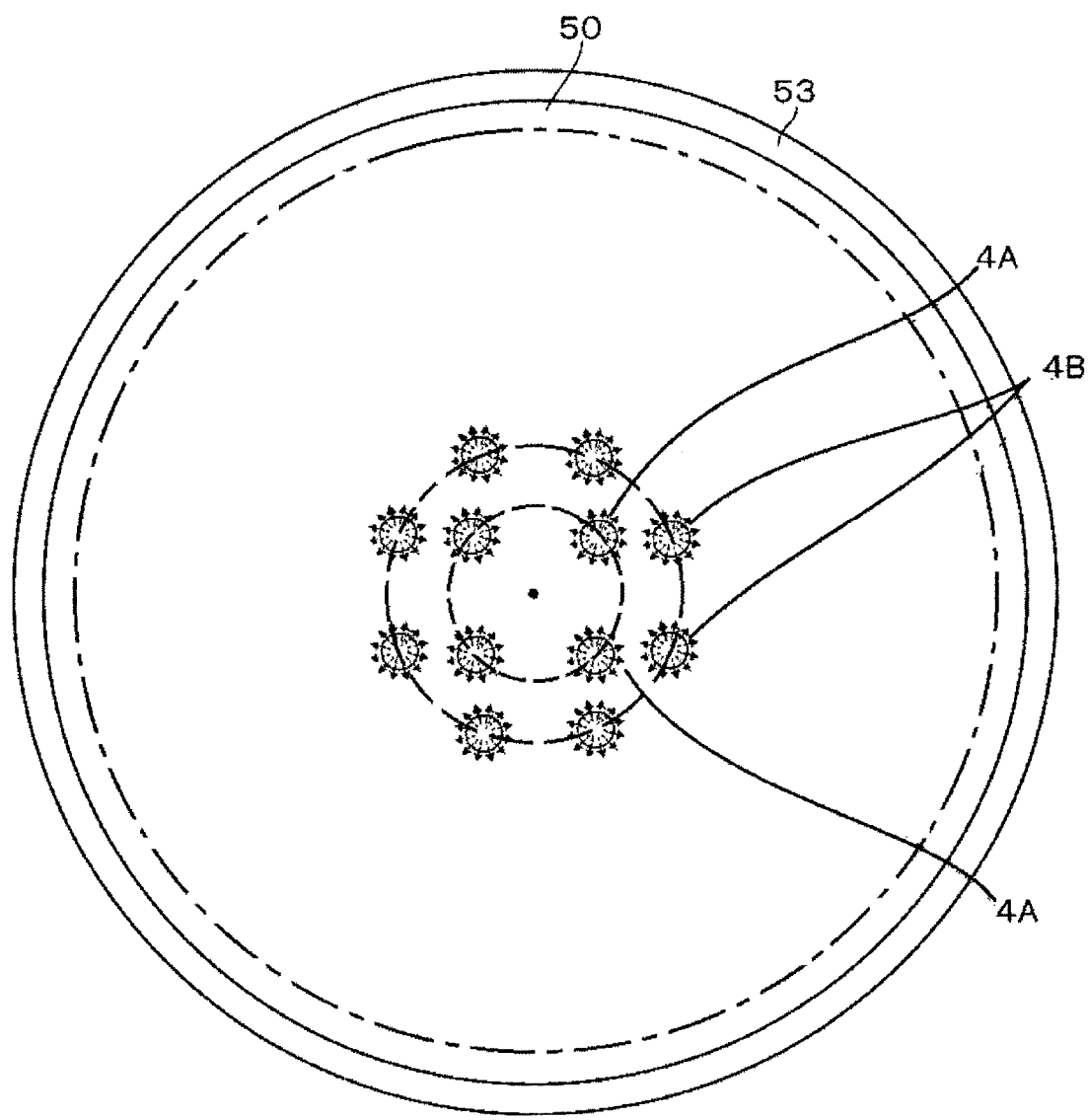
FIG. 4 is a top view of the ceiling plate member of the film forming apparatus.

As shown in FIGS. 3 and 4, in the diffusion space 50, four first gas dispersion units 4A are spaced apart from each other at a regular interval along a first circle having the center corresponding to the center of the wafer W mounted on the mounting table 2 when seen from the top. Further, eight second gas dispersion units 4B are spaced apart from each other at a regular interval along a second circle that is coaxial with the first circle and disposed at the outer side of the first circle. In the present embodiment, the first gas dispersion units 4A are respectively arranged on straight lines connecting the center of the second circle and apexes of every other arcs among eight arcs obtained by dividing the circumference of the second circle into eight parts by the centers of the second gas dispersion units 4B. When seen from the top, the second gas dispersion units 4B are preferably disposed within an area having a radius of about 90 mm or less, preferably about 50 mm in the present embodiment, from the center of the wafer W mounted on the mounting table 2, i.e., an area corresponding to about 60% of the wafer W area. A dotted line in FIG. 4 indicates a projected position of the wafer W.

Figure 5:
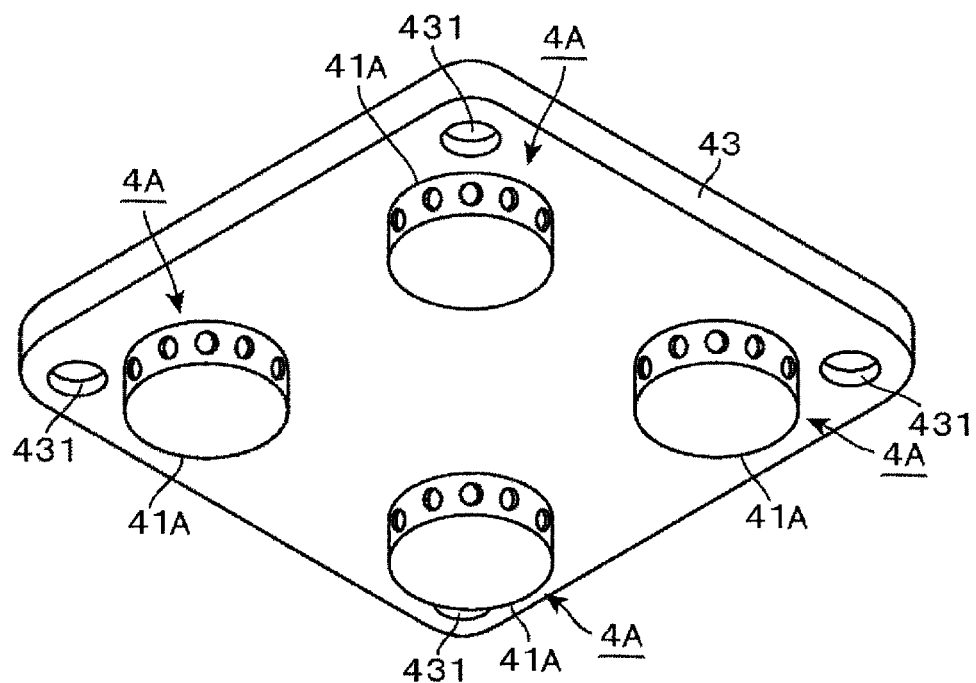
FIG. 5 is a perspective view of an exemplary first gas dispersion unit of the ceiling plate member.
Figure 6:
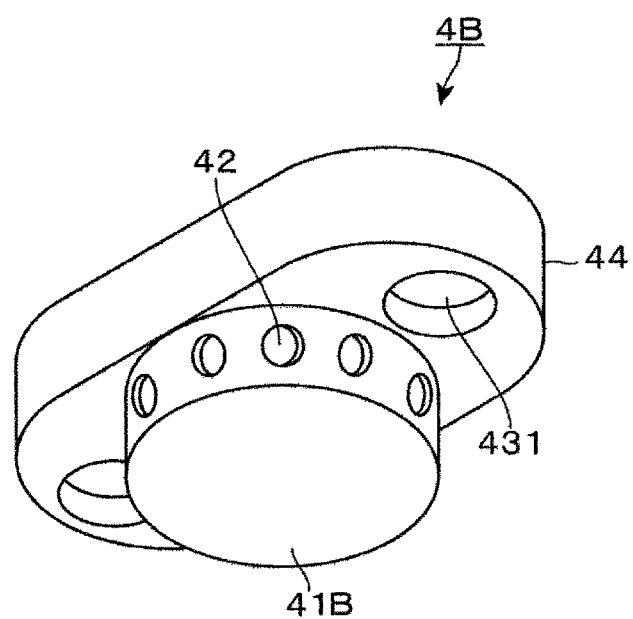
FIG. 6 is a perspective view of an exemplary second gas dispersion unit of the ceiling plate member.

As shown in FIG. 5, the four first gas dispersion units 4A have a common pedestal portion 43 to be clamped to the ceiling plate member 31, and four first head portions 41A having hollow inner portions are formed at the bottom surface of the pedestal portion 43. As shown in FIG. 6, each of the eight second gas dispersion unit 4B has a pedestal portion 44, and a single head portion 41B is formed at a bottom surface of the pedestal portion 44. Formed at the bottom surface of the ceiling plate member 31 are a single recess into which the pedestal portion 43 of the first gas dispersion units 4A is inserted and eight recesses into which the pedestal portions 44 of the second gas dispersion units 4B are inserted, respectively.

Figure 7A:
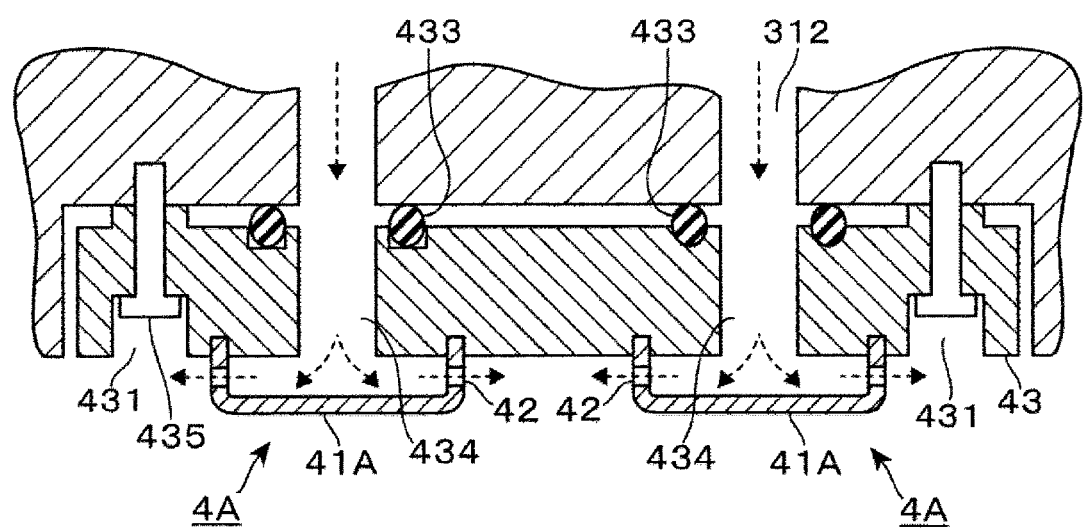
FIGS. 7A and 7B are vertical cross sectional views of the first and the second gas dispersion unit.
Figure 7B:
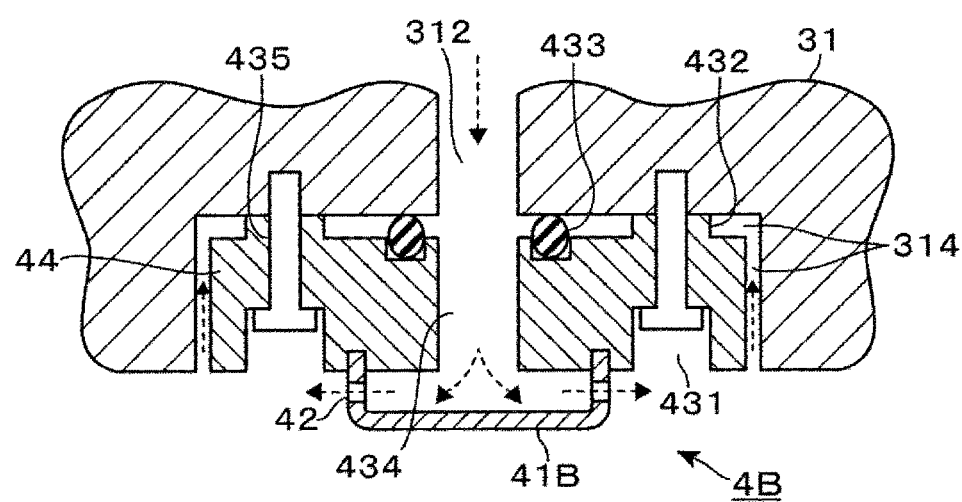

FIGS. 7A and 7B are vertical cross sectional views of the first and the second gas dispersion units 4A and 4B, respectively. When the pedestal portions 43 and 44 are inserted into the recesses corresponding thereto, the first and the second head portion 41A and 41B protrude from the bottom surface of the ceiling plate member 31 into the diffusion space 50.

A screw hole 431 is formed at each of the pedestal portions 43 and 44. By driving screws 435 into the screw holes 431 and screw holes formed in the recess of the ceiling plate member 31, the pedestal portions 43 and 44 are clamped to the ceiling plate member 31.

If a film is formed by a reactant gas introduced into a gap between the pedestal portions 43 and 44 and the ceiling plate member 31 and adhered to those members, particles may be generated during separation of the first and the second gas dispersion units 4A and 4B. The pedestal portions 43 and 44 of the present embodiment are configured to suppress the generation of particles.

The pedestal portions 43 and 44 are smaller than the recess formed at the ceiling plate member 31. A gap 314 of about 0.1 mm to 1 mm is formed between the outer circumferential surfaces of the pedestal portions 43 and 44 and the inner circumferential surface of the recess formed at the ceiling plate member 31. A ring-shaped protrusion 432 protrudes upward from the upper end portions of the screw holes 431 of the pedestal portions 43 and 44. The pedestal portions 43 and 44 are brought into contact with the ceiling plate member 31 through a contact surface of a top surface of the protrusion 432. A gap 314 having substantially the same size as that of the aforementioned gap 314 is also formed between the top surfaces of the pedestal portions 43 and 44 and the bottom surface of the recess formed at the ceiling plate member 31.

Communication paths 434 are formed through the pedestal portions 43 and 44 in a vertical direction and communicate with gas supply lines 312 formed in the ceiling plate member 31 which will be described later. An O-ring as a packing member for airtightly connecting the gas supply line 312 and the communication path 434 is provided around an opening formed at an upper end of the communication path 434.

As a result, contact portion between the pedestal portions 43 and 44 and the ceiling plate member 31 is limited to the O-ring 433 and the contact surface of the top surface of the protrusion 432, and a relatively large gap 314 is formed between the pedestal portions 43 and 44 and the ceiling plate member 31 at the other portions. Therefore, even if a film is formed by a reactant gas and a cleaning gas introduced into the gap 314, the pedestal portions 43 and 44 are hardly stuck to the ceiling plate member 31. Accordingly, it is possible to suppress the generation of particles during the separation of the first and the second gas dispersion units 4A and 4B or the like.

The first and the second head portion 41A and 41B cover lower openings of the communication paths 434 from the bottom surfaces of the pedestal portions 43 and 44. The first and the second head portion 41A and 41B are configured as a flat cylindrical-shaped cover having a diameter ranging from, e.g., 8 mm to 20 mm, e.g., 19 mm. The first head portion 41A protrudes downward from the pedestal portion 43 by a distance of 3 mm. The second head portion 41B protrudes downward from the pedestal portion 44 by a distance of 5 mm. Therefore, in the diffusion space 50, the height position of the bottom surface of the first gas dispersion unit 4A is higher than that of the bottom surface of the second gas dispersion unit 4B by a distance of 2 mm. In FIG. 1, the first and the second head portion 41A and 41B are illustrated in the same size for convenience of explanation.

A plurality of gas discharge holes 42 spaced apart from each other at a regular interval along the circumferential direction is formed at the side surface of each of the first and the second head portion 41A and 41B. It is preferable that each of the first and the second head portion 41A and 41B has at least three gas discharge holes 42. In the present embodiment, twelve gas discharge holes are formed at a regular interval. The gas discharge holes 42 are not formed in the bottom surfaces of the first and the second head portion 41A and 41B. Therefore, the gas flowing into the first and the second head portion 41A and 41B is uniformly discharged through the gas discharge holes 42 in a horizontal direction.

Referring back to FIGS. 1 and 2, the gas supply lines 312 for supplying a gas into the first and the second gas dispersion units 4A and 4B are formed in the ceiling plate member 31 provided with the first and the second gas dispersion units 4A and 4B. The gas supply lines 312 are connected to a diffusion portion 311 forming a gas buffering space formed between the top surface of the ceiling plate member 31 and the bottom surface of the supporting plate 32.

Formed in the supporting plate 32 are a gas supply line 321 for supplying an ammonia gas and a nitrogen gas for replacement to the diffusion portion 311 and a gas supply line 322 for supplying a titanium chloride gas and a nitrogen gas for replacement to the diffusion portion 311. The gas supply line 321 and the gas supply line 322 are respectively connected to an ammonia gas supply unit 62 and a titanium chloride gas supply unit 64 through lines. These lines are branched and connected to nitrogen gas supply units 61 and 63. Each of the lines is provided with an opening/closing valve 602 for starting and stopping gas supply and a flow rate control unit 601 for controlling a gas supply amount. For convenience, the nitrogen gas supply units 61 and 63 are illustrated separately in FIG. 1. However, a common nitrogen gas supply source may be used.

The film forming apparatus is connected to a control unit 7 as shown in FIG. 1. The control unit 7 includes a computer having a CPU and a storage unit (both not shown). The storage unit stores a program having a group of steps (commands) for controlling the operation of the film forming apparatus, i.e., the steps of raising the wafer W mounted on the mounting table 2 to the processing position, forming a TiN film by supplying a reactant gas and a replacement gas into the processing space 313 in a predetermined order, and unloading the wafer W that has been subjected to the film formation. The program is stored in a storage medium, e.g., a hard disc, a compact disc, a magneto-optical disc, a memory card or the like, and is installed to the computer therefrom.

Next, the operation of the film forming apparatus according to the embodiment will be described. First, an atmosphere in the processing chamber 1 is depressurized to a vacuum state and the mounting table 2 is lowered to the transfer position. The gate valve 12 is opened and a transfer arm of the wafer transfer unit provided at the vacuum transfer chamber connected to the loading/unloading port 11 enters the processing chamber 1 to transfer the wafer W onto the supporting pins 25. Next, the supporting pins 25 are lowered and the wafer W is mounted on the mounting table 2 heated to, e.g., about 440° C., by the heater 21.

Then, the gate valve 12 is closed and the mounting table 2 is raised to the processing position. The pressure in the processing chamber 1 is adjusted and, then, a titanium chloride gas is supplied from the titanium chloride gas supply unit 64. The supplied titanium chloride gas flows into the first and the second gas dispersion unit 4A and 4B through the gas supply line 322, the diffusion portion 311, and the gas supply lines 312.

Figure 8:
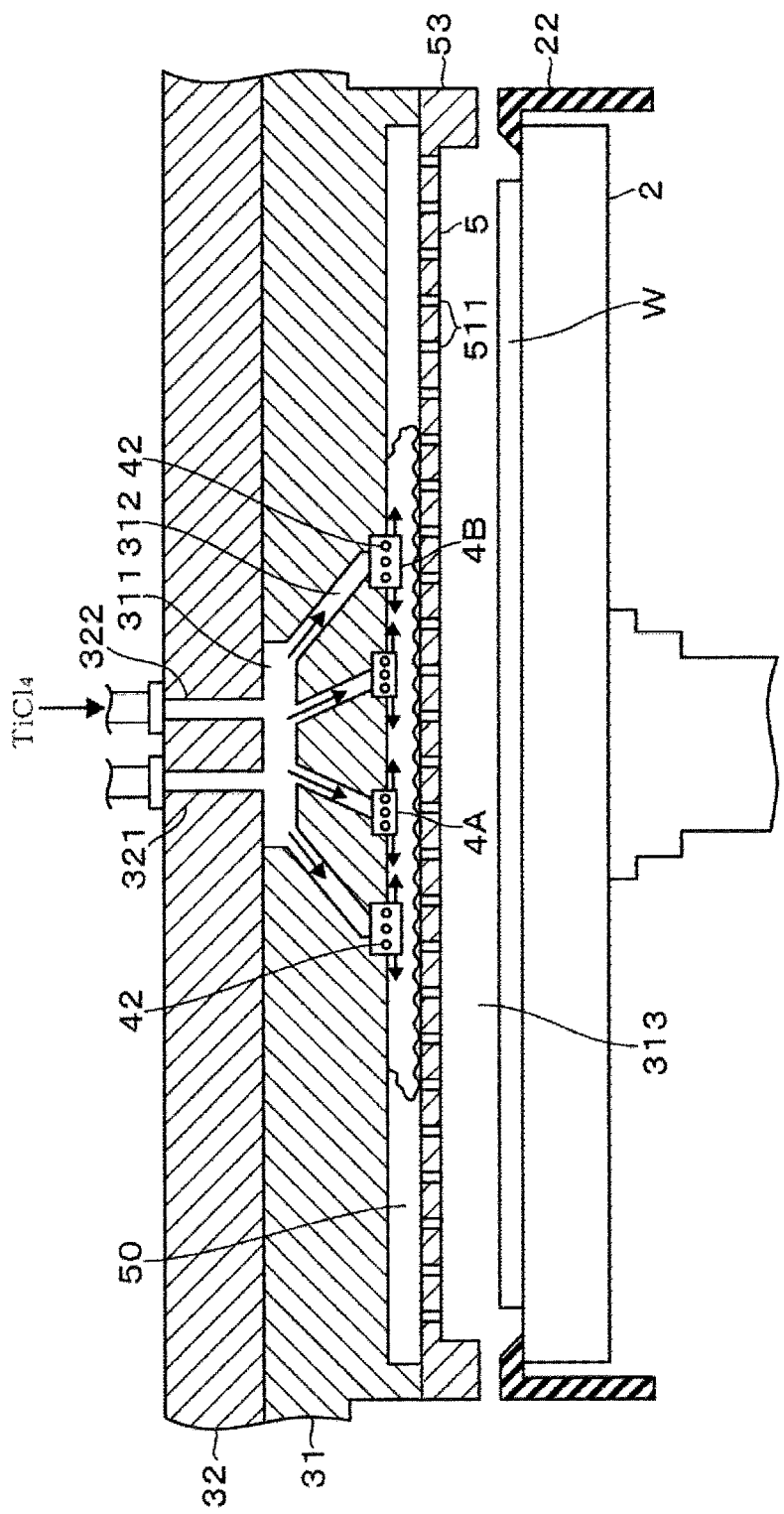
FIGS. 8 and 9 explain an operation of the film forming apparatus.

As shown in FIG. 8, the titanium chloride gas supplied from the gas supply lines 312 to the first and the second gas dispersion units 4A and 4B is discharged into the diffusion space 50 and diffused horizontally through the gas discharge holes 42 formed at peripheral walls of the first and the second head portions 41A and 41B.

As shown in FIG. 4, the first and the second gas dispersion units 4A and 4B are arranged along two coaxial circles surrounding the center of the wafer W when seen from the top. The first and the second gas dispersion units 4A and 4B respectively serve as gas dispersion sources at the central portion of the diffusion space 50 in the diametrical direction and the circumferential direction of the wafer W. In the present embodiment, the first gas dispersion units 4A at the inner side are arranged to radially correspond to the space between the adjacent second gas dispersion units 4B at the outer side, so that the gas is diffused outward from the gas dispersion sources with high uniformity of gas concentration in the circumferential direction.

The gas discharged from the first and the second gas dispersion units 4A and 4B is diffused in various directions toward the inner area surrounded by the first and the second gas dispersion units 4A and 4B. Although the gas intensively flows toward a region of the central portion of the diffusion space 50 which corresponds to the central portion of the wafer W, there is no gas dispersion unit in the region. Accordingly, the gas flows easily across the region, so that the gas hardly stagnates in the region. Further, the bottom surfaces of the first gas dispersion units 4A are located at a position higher than that of the bottom surfaces of the second gas dispersion units 4B, which makes the gas flow readily. Accordingly, the gas is diffused with high uniformity of gas concentration even at the inner side of the first and the second gas dispersion units 4A and 4B which includes the central portion of the diffusion space 50. As a result, the gas is diffused in the diffusion space 50 with high dispersiveness and high uniformity outward, inward and downward with respect to the first and the second gas dispersion units 4A and 4B. The gas discharged into the diffusion space 50 in a manner described above is slowed down due to pressure loss while passing through the gas injection holes 511 of the shower head 5 and then is dispersed into the processing space 313 as shown in FIG. 9.

Figure 9:
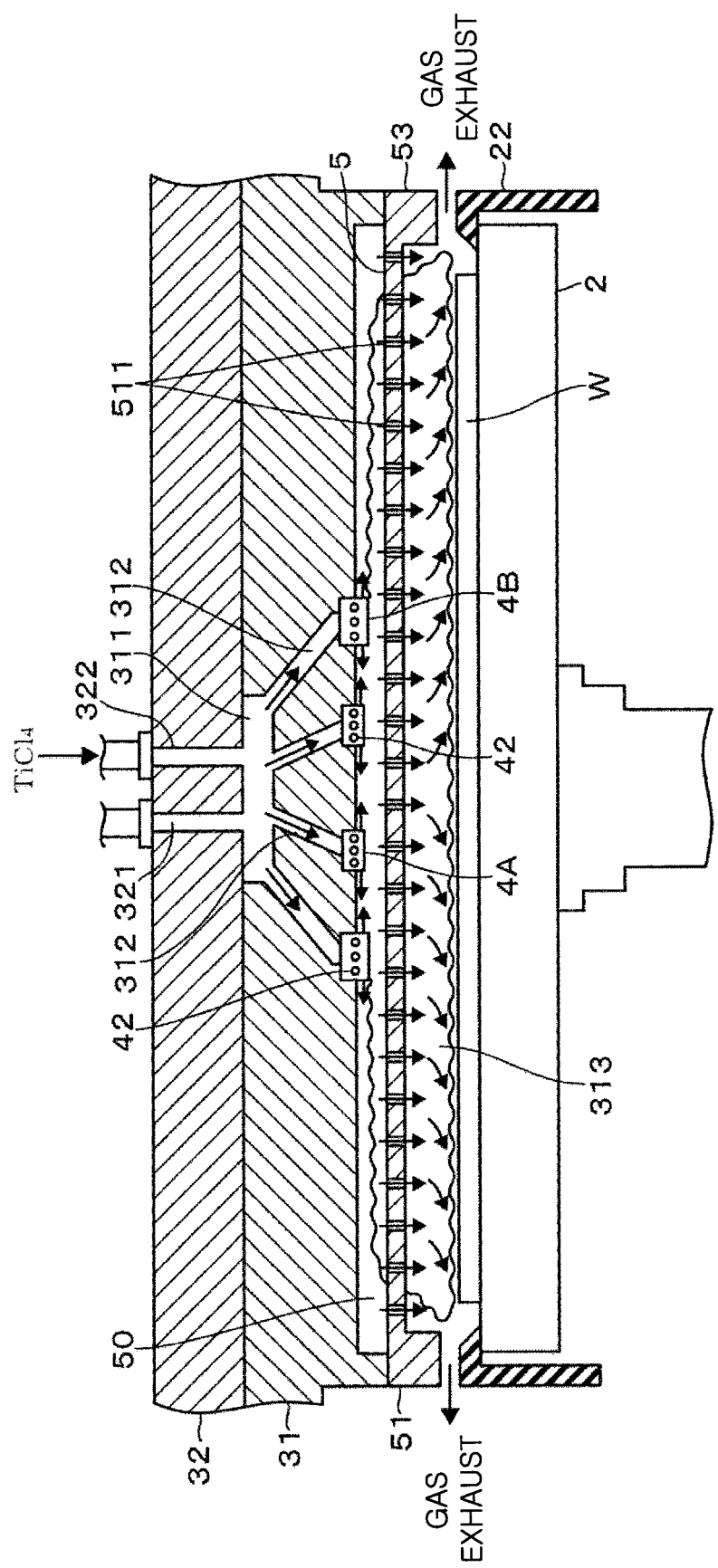

As shown in FIG. 9, the titanium chloride gas supplied into the processing space 313 flows toward the peripheral portion of the wafer W and then is discharged. Therefore, the titanium chloride gas flowing from the diffusion space 50 above the shower head 5 toward the processing space 313 is supplied to the wafer W while flowing toward the peripheral portion of the processing space 313. For example, the titanium chloride gas supplied through the gas injection holes 511 flows downward in the processing space 313 and reaches the wafer W on the mounting table 2. A portion of the titanium chloride gas is adsorbed onto the wafer W. The remaining titanium chloride gas is diffused radially in a diametrical direction along the surface of the wafer W and a portion thereof is adsorbed onto the surface of the wafer W.

The titanium chloride gas reaching the gap between the lower end of the annular protrusion 53 and the cover member through the processing space 313 flows into the processing chamber 1 through the gap and then is discharged to the outside through the gas exhaust duct 13. The titanium chloride gas supplied into the processing space 313 is supplied to the wafer W while flowing toward the peripheral portion of the wafer W. Accordingly, the supply of the titanium chloride gas to the peripheral portion of the wafer W becomes easier.

In the above flow, the pressure loss that occurs when the gas flows from the processing space 313 toward the gas exhaust duct 13 is controlled by providing the annular protrusion 53 around the shower head 5 and properly setting the height of the gap between the annular protrusion 53 and the mounting table 2 (the cover member 22). As a result, the reaction gases can be uniformly discharged to the outer side of the circumferential gap after stagnating in the processing space 313 for a period of time that is enough for adsorption on the wafer W.

Next, the supply of the titanium chloride gas is stopped, and the nitrogen gas for replacement is supplied from the nitrogen gas supply unit 63. The nitrogen gas is supplied into the processing space 313 in the same route as that of the titanium chloride gas, and the titanium chloride gas in the corresponding route and the processing space 313 is replaced with the nitrogen gas.

In this manner, the nitrogen gas is supplied for a predetermined period of time to perform the gas replacement. Then, the supply of the nitrogen gas is stopped, and the ammonia gas is supplied from the ammonia gas supply unit 62. The supplied ammonia gas flows into the first and the second gas dispersion unit 4A and 4B through the ammonia supply line 321, the diffusion portion 311, and the gas supply lines 312. The ammonia gas discharged into the diffusion space 50 from the first and the second gas dispersion units 4A and 4B is supplied into the processing space 313 in the same flowing manner as that of the titanium chloride gas.

When the ammonia gas flowing in the processing space 313 reaches the surface of the wafer W, first, the components of the titanium chloride gas adsorbed onto the wafer W are nitrided to form titanium nitride. Then, the gas supplied into the gas supply lines 312 is switched to nitrogen gas for replacement from the nitrogen gas supply unit 61, and the ammonia gas in the processing space 313 and the ammonia gas supply line is replaced with the nitrogen gas.

In this manner, a molecular layer of TiN is formed on the surface of the wafer W by supplying the reactant gases (titanium chloride gas and ammonia gas) and the replacement gas (nitrogen gas) in the order of the titanium chloride gas, the nitrogen gas, the ammonia gas and the nitrogen gas, thereby forming a titanium nitride film.

Since the gas is supplied into the diffusion space 50 by the first and the second gas dispersion units 4A and 4B, the gas can spread into the diffusion space 50 even when the height of the diffusion space 50 is low, which makes it possible to effectively replace the gas in the diffusion space 50. Accordingly, the replacement operation using the replacement gas can be performed in a short period of time by reducing the volume of the shower head 5 by decreasing the height of the diffusion space 50.

The reactant gases used in the ALD method have different fluidities. For example, titanium chloride gas easily spreads even in a narrow flow path, whereas ammonia gas does not easily spread compared to the titanium chloride gas. Due to the flat bottom surface of the shower head 5 which faces the wafer W mounted on the mounting table 2, the distance between the top surface of the wafer W and the bottom surface of the shower head 5 is uniform. Accordingly, the reactant gases can be uniformly diffused in the processing space 313 having a uniform height regardless of the fluidity difference. As a result, the film formed on the wafer W has good in-plane thickness uniformity.

By repeating the supply of the titanium chloride gas and the supply of the ammonia gas several tens of times to several hundreds of times, a titanium chloride film having a desired film thickness is formed. Then, a nitrogen gas for replacement is supplied to discharge the last ammonia gas. Next, the mounting table 2 is lowered to the transfer position. Thereafter, the gate valve 12 is opened and the transfer arm enters the processing chamber 1. The wafer W is transferred to the transfer arm from the supporting pins 25 in the reverse sequence of the loading operation. Next, the wafer W that has been subjected to the film formation is unloaded, and a next wafer W is loaded.

In the film forming apparatus of the above embodiment, distribution area of the gas injection holes 511 of the shower head 5 provided above the mounting table 2 is wider than the area of the wafer W. A plurality of gas dispersion units, each having the gas discharge holes 42 formed along the circumferential direction thereof for diffusing a gas in a horizontal direction, is provided in the diffusion space 50 above the shower head 5. The four first gas dispersion units 4A are arranged on the first circle having the center same as that of the wafer W, and the eight second gas dispersion units 4B are arranged on the second circle outward of the first circle. Accordingly, it is difficult for the gas to stagnate at the central portion of the wafer W in the diffusion space 50. Further, the film forming process can be performed while ensuring good in-plane uniformity due to good dispersiveness of a gas.

Figure 10:
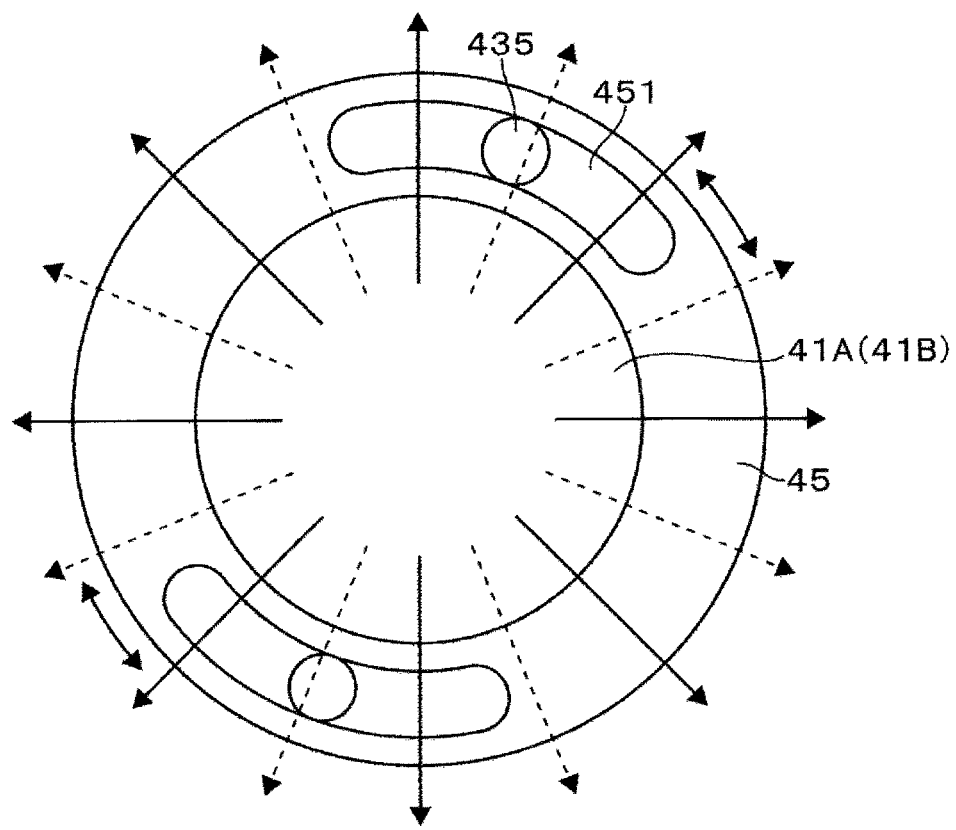
FIG. 10 is a top view of another exemplary first and second gas dispersion unit.

In another embodiment, the direction of discharging the processing gas may be adjusted by rotating the first and the second gas dispersion units 4A and 4B in a horizontal plane. For example, as shown in FIG. 10, each of the first and second head portions 41A and 41B is connected to a corresponding pedestal portion 45 having a disc-shaped, the pedestal portion 45 including screw holes 451 for fixing the pedestal portion 45 to the ceiling plate member 31 by screw 435. The screw holes 451 have a margin for rotating the first and the second gas dispersion units 4A and 4B, to allow the adjustment of the gas discharging direction. By adjusting the gas discharging directions of the first and the second gas dispersion units 4A and 4B as described above, gas flow direction in the diffusion space 50 can be adjusted. As described above, easiness of gas flow and easiness of gas stagnation vary depending on distances between the first dispersion units 4A and the second dispersion units 4B in the diffusion space 50 or distances from the first and the second dispersion units 4A and 4B to the wall surface. Therefore, the in-plane uniformity of the concentration of the processing gas supplied to the wafer W can be controlled by adjusting the gas discharging direction. Accordingly, the film thickness distribution of the film formed on the wafer W can be controlled.

If the number of the first gas dispersion units 4A is two or less, it is difficult to uniformly distribute the gas in a horizontal direction in the diffusion space 50 and, thus, it is preferable to provide at least three first gas dispersion units 4A. Further, it is preferable to provide at least five second gas dispersion units 4B. It is more preferable to provide the second gas dispersion units 4A of which number is twice the number of the first gas dispersion units 4A. The second circle on which the second gas dispersion units 4B are arranged is located at the outer side of the first circle on which the first gas dispersion units 4A are arranged. Therefore, if the number of the second gas dispersion units 4B is small, the concentration of the processing gas near the peripheral portion of the diffusion space 50 may be decreased. Thus, by providing at least five second gas dispersion units 4B, more preferably by providing the second gas dispersion units 4B of which number is more than twice the number of the first gas dispersion units 4A, the decrease in the gas concentration near the peripheral portion of the diffusion space 50 can be suppressed. As a result, it is possible to suppress the decrease in the film thickness at the peripheral portion of the wafer W.

It is preferable that the first and the second gas dispersion units 4A and 4B are not disposed on the same straight line when seen from the radial direction of the second circle. For example, when the number (2n) of the second gas dispersion units 4B is twice the number (n) of first gas dispersion units 4A, it is preferable to employ the arrangement layout of the embodiment described above. In other words, it is preferable to provide the first gas dispersion units 4A on a straight line connecting the center of the second circle and apexes of every other arcs obtained by dividing the circumference of the second circle into 2n parts by the centers of the second gas dispersion units 4B. With this configuration, the gas discharged from the first gas dispersion units 4A can easily flow between the second gas dispersion units 4B, and the gas discharged from the second gas dispersion units 4B can easily flow between the first gas dispersion units 4A. Accordingly, the processing gas is uniformly diffused in the diffusion space 50 without stagnation. As a result, the in-plane thickness uniformity of the film formed on the wafer W is further improved.

In this disclosure, it is preferable to arrange the first and the second gas dispersion units 4A and 4B at a regular interval on the first and the second circle, respectively. Here, "regular interval" may include a substantially regular interval that is not completely regular due to an installation allowance. Although there is no advantage to make circumferential dimensions thereof different with each other by a few %, the effect of the disclosure can be obtained even when the circumferential dimensions are deviated by a few %. Therefore, a case having such a deviated dimension is also included in "regular interval".

The film forming apparatus of the disclosure may form, other than the aforementioned TiN film, a film containing a metal element, e.g., Al, Si or the like as an element of group 3 of the periodic table, Ti, Cr, Mn, Fe, Co, Ni, Cu, Zn, Ge or the like as an element of group 4 of the periodic table, Zr, Mo, Ru, Rh, Pd, Ag or the like as an element of group 5 of the periodic table, and Ba, Hf, Ta, W, Re, Ir, Pt or the like as an element of group 6 of the periodic table. For making metal source be adsorbed onto the surface of the wafer W, an organic metal compound or an inorganic metal compound of the above metal elements may be used as a reaction gas (source gas). Specific examples of the metal source include, other than the aforementioned $TiCl_4$, BTBAS (bistertiary-butylamino)silane), DCS (dichlororosilane), HCD (hexachlorodisilane), TMA (trimethylaluminum), 3DMAS (tris dimethylamino silane) and the like.

The reaction with respect to the source gas adsorbed onto the surface of the wafer W to obtain a desired film includes various reactions, e.g., an oxidation reaction using $O_2$, $O_3$, $H_2O$ or the like, a reduction reaction using $H_2$, an organic acid such as HCOOH, $CH_3COOH$ or the like, or an alcohol such as $CH_3OH$, $C_2H_5OH$ or the like, a carbonization reaction using $CH_4$, $C_2H_6$, $C_2H_4$, $C_2H_2$ or the like, and a nitriding reaction using $NH_3$, $NH_2NH_2$, $N_2$ or the like.

Further, as the reactant gas, three types or four types of reactant gases may be used. For example, when three types of reactant gases are used, a film of strontium titanate ($SrTiO_3$) may be formed. For example, there are used Sr(THD)$_2$ (strontium bis tetramethyl heptanedionate) as a Sr source, Ti(OiPr)$_2$(THD)$_2$ (titanium bis isoproxide bis tetramethyl heptnedionate) as a Ti source, and ozone gas as an oxidizing gas are used. In that case, the gases are switched in the order of Sr source gas, replacement gas, oxidizing gas, replacement gas, Ti source gas, replacement gas, oxidizing gas and replacement gas. Although a circular wafer W has been described as a substrate to be subjected to a film forming process, the disclosure may be applied to a rectangular glass substrate (LCD substrate).

TEST EXAMPLES

The following tests were executed to verify the effect of the disclosure.

Test Example 1

A titanium nitride film was formed on the wafer W by the ALD method described in the above embodiment by using the film forming apparatus shown in FIG. 1 and, then, the in-plane uniformity of the film thickness of the titanium nitride film was examined. A titanium chloride gas was used as a source gas. An ammonia gas was used as a reactant gas. A film forming process for obtaining a film thickens of 150 Å at a film forming temperature of 530° C. and a film forming process for obtaining a film thickness of 100 Å at a film forming temperature of 440° C. were performed.

Test Example 2

A film forming process was performed under the same condition as that of the test example 1 except that the first head portion 41A of the first gas dispersion unit 4A was replaced by the second head portion 41B of the second gas dispersion unit 4B.

Comparative Example

A film forming process was performed under the same condition as that of the test example 1 except that a gas dispersion unit having the same dimension as that of the second gas dispersion unit 4B was provided, instead of the first gas dispersion unit 4A, at the central portion of the diffusion space 50.

Figure 11:
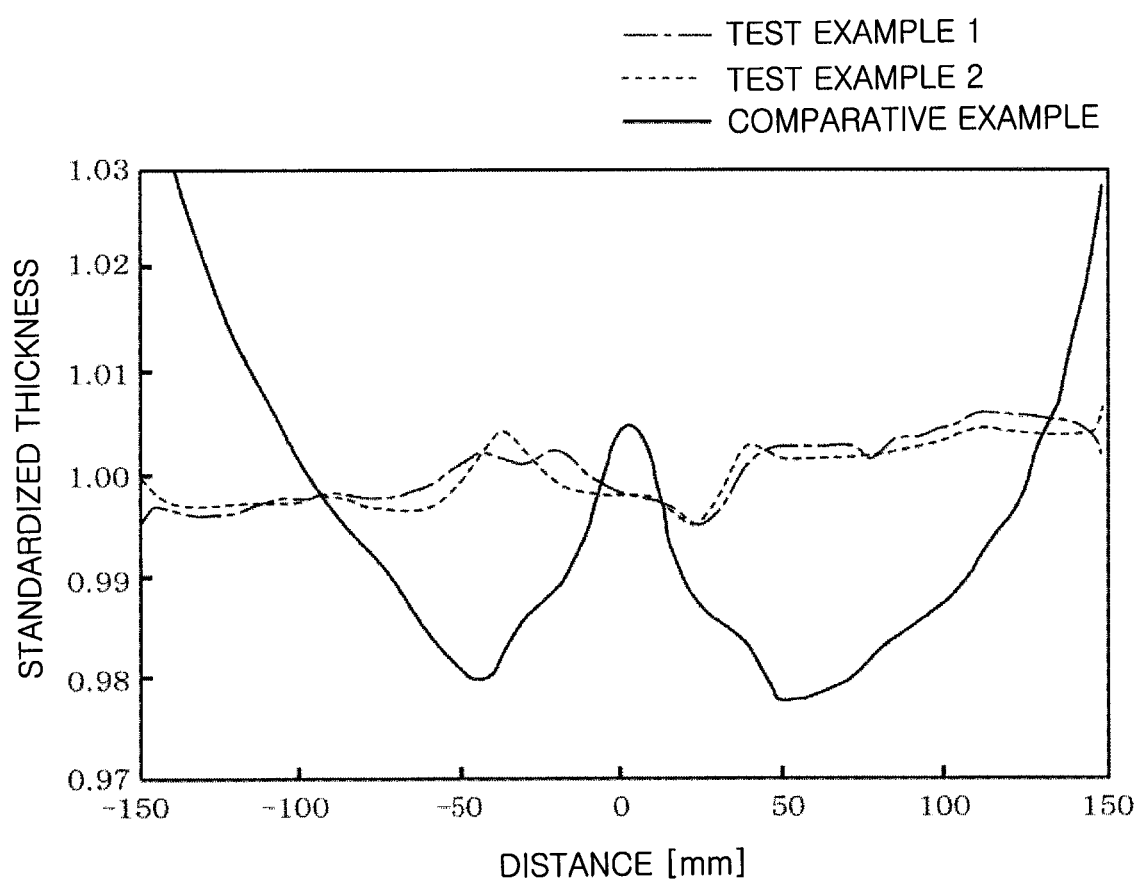
FIGS. 11 and 12 are characteristic diagrams showing in-plane thickness distribution of films formed in a test example for the embodiment and a comparative example.
Figure 12:
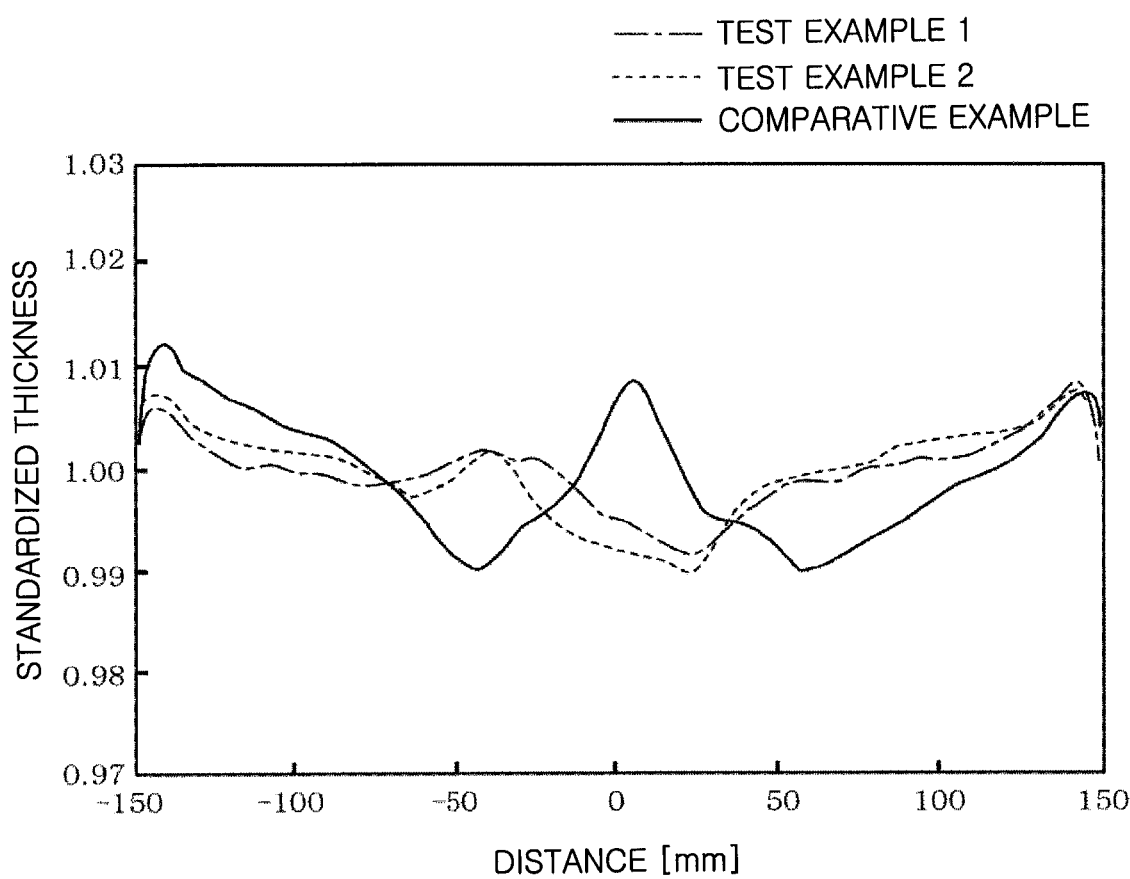

FIG. 11 shows in-plane distribution of the thicknesses of the films formed in the test examples 1 and 2 and the comparative example in the case of setting the film forming temperature to 530° C. FIG. 12 shows in-plane distribution of the thicknesses of the films formed in the test examples 1 and 2 and the comparative example in the case of setting the film forming temperature to 440° C. In FIGS. 11 and 12, the horizontal axis represents a distance from the center of the wafer W on a straight line passing through the center of the wafer W, and the vertical axis represents a film thickness at each location which is standardized based on the average film thickness of the wafer set to 1.

Tables 1 and 2 show a maximum value of a film thickness (Max: Å), a minimum value of the film thickness (Min: Å), an average film thickness (Ave: Å), a difference between the maximum value and the minimum value [(Max−Min): Å], a ratio of the difference between the maximum value and the minimum value with respect to the average film thickness [100×(Max−Min)/Ave] and 1σ % (percentage obtained by dividing the standard deviation σ by the average) in the test examples 1 and 2 and the comparative example in the case of setting the film forming temperatures to 530° C. and 440° C.

TABLE 1

| 530° C. | Test example 1 | Test example 2 | Comparative example |
|---|---|---|---|
| Max Å | 152.8 | 153.3 | 172.3 |
| Min Å | 151.1 | 151.7 | 160.3 |
| Ave Å | 152.0 | 152.5 | 163.9 |
| Max − Min Å | 1.6 | 1.6 | 12.0 |
| 100 × Max − Min/Ave | 0.5 | 0.5 | 3.7 |
| 1σ % | 0.3 | 0.3 | 2.0 |

TABLE 2

| 440° C. | Test example 1 | Test example 2 | Comparative example |
|---|---|---|---|
| Max Å | 105.9 | 106.2 | 107.0 |
| Min Å | 104.2 | 104.3 | 104.7 |
| Ave Å | 105.1 | 105.4 | 105.7 |
| Max − Min Å | 1.7 | 1.9 | 2.3 |
| 100 × Max − Min/Ave | 0.8 | 0.9 | 1.1 |
| 1σ % | 0.4 | 0.4 | 0.6 |

According to the above result, in the case of setting the film forming temperature to 530° C. as shown in FIG. 11 and Table 1, in the comparative example, the film thickness was thick at the central portion of the wafer W, and was decreased at the portion spaced from the central portion by a distance of about 50 mm and increased at the peripheral portion. The difference between the maximum value and the minimum value of the film thickness was 12.0 Å and 1σ % was 2.0.

On the other hand, in the test examples 1 and 2, the difference between the maximum value and the minimum value of the film thickness was 1.6 Å and 1σ % was 0.3.

In the case of setting the film forming temperature to 440° C. as shown in FIG. 12 and Table 2, in the comparative example, the film thickness was thick at the central portion of the wafer W, and was decreased at the portion spaced from the central portion by a distance of about 50 mm and increased at the peripheral portion. The difference between the maximum value and the minimum value of the film thickness was 2.3 Å and 1σ % was 0.6.

On the other hand, in the test example 1, the film thickness was thin at the central portion of the wafer W and the difference between the maximum value and the minimum value of the film thickness was 1.7 Å. In the test example 2, the film thickness was thin at the central portion of the wafer W as in the case of the test example 1. The difference between the maximum value and the minimum value of the film thickness was 1.9 Å and 1σ % was 0.4.

The above result shows that the in-plane uniformity of the film thickness is better in the test examples 1 and 2 than in the comparative example when the film forming temperature is 440° C. or 530° C. According to the above result, the in-plane uniformity of the film thickness can be improved by performing a film forming process by using the film forming apparatus of the disclosure.

While the disclosure has been shown and described with respect to the embodiments, it will be understood by those skilled in the art that various changes and modifications may be made without departing from the scope of the disclosure as defined in the following claims.

What is claimed is:

1. A film forming apparatus for performing a film forming process by sequentially supplying plural types of reactant gases that react with one another to a substrate in a processing chamber in a vacuum atmosphere and supplying a replacement gas between supply of one reactant gas and supply of a next reactant gas, the film forming apparatus comprising:
a mounting table provided in the processing chamber, and configured to mount thereon the substrate;
a gas diffusion unit, disposed above the mounting table, the gas diffusion unit serving as a ceiling portion of the film forming apparatus and having a plurality of gas injection holes for injecting a gas in a shower shape, and outermost gas injection holes being arranged outward of an outer circumference of the substrate when seen from the top;
a plurality of gas dispersion units provided above the gas diffusion unit to face the gas diffusion unit through a diffusion space therebetween, each of the gas dispersion units having gas discharge holes formed along a circumferential direction thereof to disperse a gas horizontally into the diffusion space;
an evacuation unit configured to evacuate the processing chamber; and
a ceiling plate member which is provided above the gas diffusion unit,
wherein the gas dispersion units include at least three first gas dispersion units spaced apart from each other at a regular interval along a first circle having a center corresponding to a center of the substrate on the mounting table when seen from the top and at least three second gas dispersion units spaced apart from each other at a regular interval along a second circle concentrically disposed at an outer side of the first circle,
wherein a height of bottom surfaces of the first gas dispersion units is higher than a height of bottom surfaces of the second gas dispersion units,
wherein each of the first and the second gas dispersion units has a head portion,
wherein each head portion is connected to a corresponding pedestal portion having a disc-shaped, and
wherein the corresponding pedestal portion for each head portion includes screw holes for fixing the pedestal portion to the ceiling plate member and the screw holes have a margin for rotating the first and second gas dispersion units, and
wherein gas discharging directions of the first and the second gas dispersion units are configured to be adjusted by rotating the first and the second gas dispersion units.

2. The film forming apparatus of claim 1, further comprising an annular protrusion which protrudes downward from the ceiling portion at an outer side of a distribution area of the gas injection holes,
wherein a gap is formed between the annular protrusion and a top surface of the mounting table.

3. The film forming apparatus of claim 1, wherein the number of the second gas dispersion units is five or more.

4. The film forming apparatus of claim 1, wherein the number of the second gas dispersion units is at least twice the number of the first gas dispersion units.

5. The film forming apparatus of claim 1, wherein the second gas dispersion units are located in an area within 60% of a diameter of the wafer when seen from the top.

6. The film forming apparatus of claim 1, wherein each of the gas dispersion units has a closed bottom surface.

7. The film forming apparatus of claim 1, wherein a height of gas discharge holes of the first gas dispersion units is higher than a height of gas discharge holes of the second gas dispersion units.

8. The film forming apparatus of claim 1, wherein the first gas dispersion units and the second gas dispersion units are not disposed on a straight line when seen from a radial direction of the second circle.

9. The film forming apparatus of claim 1, wherein a distance from a center of the gas diffusion unit to an outer periphery of the diffusion space is larger than a distance from the center of the gas diffusion unit to the outermost gas injection holes.

10. A film forming apparatus for performing a film forming process by sequentially supplying plural types of reactant gases that react with one another to a substrate in a processing chamber in a vacuum atmosphere and supplying a replacement gas between supply of one reactant gas and supply of a next reactant gas, the film forming apparatus comprising:
- a mounting table provided in the processing chamber, and configured to mount thereon the substrate;
- a gas diffusion unit, disposed above the mounting table, the gas diffusion unit serving as a ceiling portion of the film forming apparatus and having a plurality of gas injection holes for injecting a gas in a shower shape, and outermost gas injection holes being arranged outward of an outer circumference of the substrate when seen from the top;
- a plurality of gas dispersion units provided above the gas diffusion unit to face the gas diffusion unit through a diffusion space therebetween, each of the gas dispersion units having gas discharge holes formed along a circumferential direction thereof to disperse a gas horizontally into the diffusion space;
- an evacuation unit configured to evacuate the processing chamber; and
- a ceiling plate member which is provided above the gas diffusion unit,
- wherein the gas dispersion units include at least three first gas dispersion units spaced apart from each other at a regular interval along a first circle having a center corresponding to a center of the substrate on the mounting table when seen from the top and at least three second gas dispersion units spaced apart from each other at a regular interval along a second circle concentrically disposed at an outer side of the first circle, and
- wherein a height of bottom surfaces of the first gas dispersion units is higher than a height of bottom surfaces of the second gas dispersion units,
- wherein a central portion of the diffusion space corresponding to a central portion of the substrate is devoid of a gas dispersion unit,
- wherein each of the first and the second gas dispersion units has a head portion,
- wherein each head portion is connected to a corresponding pedestal portion having a disc-shaped, and
- wherein the corresponding pedestal portion for each head portion includes screw holes for fixing the pedestal portion to the ceiling plate member and the screw holes have a margin for rotating the first and second gas dispersion units, and
- wherein gas discharging directions of the first and the second gas dispersion units are configured to be adjusted by rotating the first and the second gas dispersion units.

11. The film forming apparatus of claim 10, wherein a distance from a center of the gas diffusion unit to an outer periphery of the diffusion space is larger than a distance from the center of the gas diffusion unit to the outermost gas injection holes.

* * * * *